(12) United States Patent
David et al.

(10) Patent No.: US 9,929,040 B2
(45) Date of Patent: Mar. 27, 2018

(54) PROCESS FOR FABRICATING A STRUCTURE HAVING A BURIED DIELECTRIC LAYER OF UNIFORM THICKNESS

(71) Applicant: Soitec, Bernin (FR)

(72) Inventors: Carole David, Crolles (FR); Anne-Sophie Cocchi, Le Terrasse (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/083,725

(22) Filed: Mar. 29, 2016

(65) Prior Publication Data

US 2016/0293476 A1    Oct. 6, 2016

(30) Foreign Application Priority Data

Mar. 30, 2015 (FR) .................................... 15 52651

(51) Int. Cl.
| | |
|---|---|
| *H01L 29/20* | (2006.01) |
| *H01L 21/36* | (2006.01) |
| *H01L 21/762* | (2006.01) |
| *H01L 21/324* | (2006.01) |
| *H01L 29/51* | (2006.01) |

(52) U.S. Cl.
CPC .... *H01L 21/76251* (2013.01); *H01L 21/3247* (2013.01); *H01L 21/76254* (2013.01); *H01L 21/76281* (2013.01); *H01L 29/51* (2013.01); *H01L 29/511* (2013.01); *H01L 2224/11849* (2013.01); *H01L 2224/11901* (2013.01)

(58) Field of Classification Search
CPC ................... H01L 29/511; H01L 29/51; H01L 2224/11849; H01L 2224/11901
See application file for complete search history.

(56) References Cited

U.S. PATENT DOCUMENTS

| | | | | |
|---|---|---|---|---|
| 5,658,809 | A | * | 8/1997 | Nakashima ....... H01L 21/76243 257/E21.339 |
| 2004/0121598 | A1 | * | 6/2004 | Achutharaman . H01L 21/02238 438/689 |

(Continued)

FOREIGN PATENT DOCUMENTS

| | | |
|---|---|---|
| FR | 2843487 | 2/2004 |
| FR | 2998418 A1 | 5/2014 |

OTHER PUBLICATIONS

Kononchuck et al., Novel trends in SOI Technology for CMOS applications, Solid State Phenomena, vols. 156-158, (2010), pp. 69-76 (abstract only).

*Primary Examiner* — Zandra Smith
*Assistant Examiner* — John M Parker
(74) *Attorney, Agent, or Firm* — TraskBritt

(57) ABSTRACT

A process is used for fabricating a final structure comprising in succession a useful semiconductor layer, a dielectric layer and a carrier substrate. The process comprises providing an intermediate structure including an upper layer, the dielectric layer and the carrier substrate, and finishing the intermediate structure to form the final structure by performing a treatment nonuniformly modifying the thickness of the dielectric layer following a predetermined dissolution profile. The dielectric layer of the intermediate structure has a thickness profile complementary to the predetermined dissolution profile.

20 Claims, 3 Drawing Sheets

(56) References Cited

U.S. PATENT DOCUMENTS

2004/0121605 A1* 6/2004 Maydan .............. H01L 21/0214
                                                            438/694
2005/0118789 A1   6/2005 Aga et al.
2009/0246371 A1  10/2009 Koehler et al.
2012/0190170 A1   7/2012 Kononchuk

* cited by examiner

PROCESS FOR FABRICATING A STRUCTURE HAVING A BURIED DIELECTRIC LAYER OF UNIFORM THICKNESS

PRIORITY CLAIM

Pursuant to 35 U.S.C. § 119(a), this application claims the benefit of the filing date of French Patent Application Serial No. 1552651, filed Mar. 30, 2015, for "Process for Fabricating a Structure Having a Buried Dielectric Layer of Uniform Thickness," the contents of which are incorporated herein in their entirety by this reference.

TECHNICAL FIELD

The present invention relates to the fabrication of a final structure comprising in succession a useful semiconductor layer, a dielectric layer and a carrier substrate. These structures are especially applicable in the fields of microelectronics, micromechanics, photonics, etc.

BACKGROUND

Various processes allowing an intermediate structure comprising in succession an upper semiconductor layer, a dielectric layer, and a carrier substrate to be formed are known from the prior art. It may, for example, be a question of layer-transfer fabrication processes (such as the processes known by the names SMART CUT® or ELTRAN™) or even of the oxygen-implantation fabrication process (and known by the acronym SIMOX: Separation by Implantation of Oxygen).

This intermediate structure, during a following finishing step, undergoes various treatments in order to convert the upper layer into a useful layer having all the expected properties especially in terms of average thickness, thickness uniformity, roughness, crystal quality, etc.

These known processes are especially employed for the fabrication of silicon-on-insulator substrates. In this case, the upper layer, the useful layer and the carrier typically consist of silicon and the dielectric layer of silicon dioxide.

These silicon-on-insulator substrates must satisfy very precise specifications. This is especially the case for the average thickness and the thickness uniformity of the dielectric layer. Satisfaction of these specifications is required for proper operation of the semiconductor devices that will be formed in and on the useful layer.

In certain cases, the architecture of the semiconductor devices requires a silicon-on-insulator substrate having a dielectric layer of very insubstantial (i.e., small) average thickness to be provided. Thus, the dielectric layer may be specified to have an average thickness smaller than or equal to 50 nm and typically between 10 and 25 nm. It is particularly important in the case of small average thickness to precisely control the thickness of the dielectric layer at every point.

Among the conventional finishing treatments applied to an intermediate structure, smoothing anneal treatments, in which the upper layer or useful layer is exposed to a neutral or reducing atmosphere raised to a high temperature, typically higher than 1,100° C., are known. This treatment, inter alia, allows, the roughness of the layer exposed to the high-temperature atmosphere to be decreased by surface reconstruction.

However, this treatment is liable, to modify the properties of the subjacent dielectric layer, such as its thickness via an oxide dissolution effect. This phenomenon is reported in the document "Novel trends in SOI Technology for CMOS applications" by O. Kononchuk et al. published in the review Solid State Phenomena, volume 156-158 (2010) p. 69 to 76. Specifically, this document explains that, in the high-temperature reducing or neutral treatment atmospheres, oxygen atoms of the dielectric layer are liable to diffuse through the upper layer and to react with the surface thereof to produce volatile species that are evacuated by the atmosphere of the furnace. This document also explains that for SOI substrates having a thin upper layer, the phenomenon of diffusion is limited by the capacity of evacuation of volatile species from the surface of the substrate, and therefore that the magnitude of the dissolution phenomenon is locally related to the gas speed of the atmosphere of the furnace in proximity to the surface.

As a result thereof, generally, at the end of this treatment, the substrate has a dielectric layer with significantly degraded thickness uniformity. Thus, FIG. 1A shows an intermediate structure 1 obtained according to a prior-art process described by way of introduction. It will be noted that this structure has a dielectric layer 2 of uniform thickness positioned between an upper semiconductor layer 3 and a carrier substrate 4.

FIG. 1B for its part shows a final structure 5 after application of a smoothing anneal treatment similar to that presented in the document introduced above. In this particular example, the dissolution of the dielectric layer 2 through the upper layer 3 is nonuniform and it is more substantial on the periphery of the carrier substrate 4 than at its center. This leads to the formation of a final structure 5 having a nonuniform dielectric layer 2' under the useful layer 3'.

Researched solutions to this problem aim to modify the parameters of the anneal or the configuration of the annealing equipment in order to limit the magnitude thereof. These solutions are generally imperfect or require expensive investments in particular pieces of equipment.

BRIEF SUMMARY

One aim of the present disclosure is to therefore provide a process for fabricating a structure comprising a useful semiconductor layer, a dielectric layer and a carrier substrate, the dielectric layer having a well-controlled thickness uniformity and the process not having the aforementioned drawbacks.

The present disclosure generally relates to a process for fabricating a final structure comprising in succession a useful semiconductor layer, a dielectric layer and a carrier substrate, the process comprising:

a step of providing an intermediate structure including an upper semiconductor layer, the dielectric layer and the carrier substrate; and a step of finishing the intermediate structure to form the final structure, comprising a treatment nonuniformly modifying the thickness of the dielectric layer following a predetermined dissolution profile.

According to the invention, the dielectric layer of the intermediate structure has a thickness profile complementary to the predetermined dissolution profile.

Contrary to the solutions of the prior art, it is not sought to improve the uniformity of the dissolution phenomenon that acts during the finishing step; but this phenomenon is compensated for by providing a nonuniform dielectric layer in the intermediate structure, of complementary profile to the dissolution profile. This process thus allows the thickness uniformity of the dielectric layer to be controlled without making modifications to the equipment used to fabricate the structures.

According to other advantageous and nonlimiting features of the invention, taken individually or in any combination thereof:

- the useful layer may be made of silicon and the dielectric layer may be made of silicon oxide;
- the carrier substrate may be a silicon substrate;
- the useful layer may have an average thickness smaller than 100 nm and the dielectric layer of the final structure may have an average thickness smaller than or equal to 50 nm;
- the dielectric layer may have an average thickness of between 5 and 50 nm, and may have an average thickness of between 10 and 25 nm;
- the thickness uniformity (i.e., variation in thickness) of the dielectric layer of the final structure may be lower than 3%;
- the intermediate and final structures may have the form of circular wafers of 300 mm diameter or more;
- the step of providing the intermediate structure may comprise:
  - forming a dielectric layer on a donor substrate;
  - forming a weak plane in the donor substrate defining with a main surface of the donor substrate a layer to be removed;
  - assembling the main face of the donor substrate with the carrier substrate; and
  - detaching the layer to be removed from the donor substrate in order to add it to the carrier substrate;
- the weak plane may be produced by implanting light species or by porosification of a surface of a starting substrate and by epitaxial deposition of the upper layer on the starting substrate;
- the process may include a finishing step that comprises thinning the upper layer by sacrificial oxidation in order to form the useful layer;
- the finishing step may comprise a treatment by stabilization anneal of the intermediate structure or the final structure;
- the treatment modifying the thickness of the dielectric layer may comprise exposing the useful layer or the upper layer to a neutral or reducing atmosphere at a temperature of between 1,150° C. and 1,200° C.;
- the exposure to the neutral or reducing atmosphere may be carried out for a length of time of between 5 minutes and 5 hours; and
- the thickness profile of the dielectric layer of the intermediate structure and the dissolution profile may have a circular symmetry of axis perpendicular to the plane of the structure and passing through its center.

BRIEF DESCRIPTION OF THE DRAWINGS

The present disclosure will be better understood in light of the following description of one particular nonlimiting embodiment of the invention provided with reference to the accompanying figures, in which.

DETAILED DESCRIPTION

The process according to the present disclosure is generally applicable to the fabrication of a final structure comprising a useful semiconductor layer, a dielectric layer and a carrier substrate.

Figure 1A:
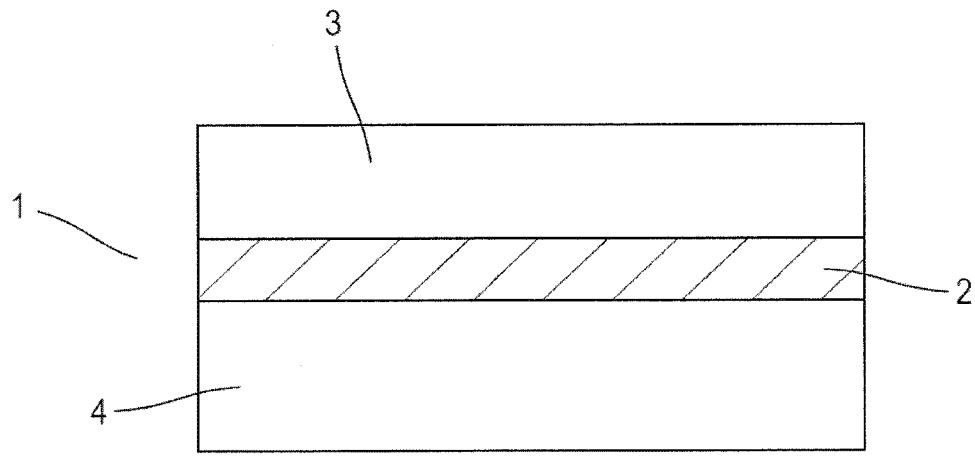
FIGS. 1A and 1B show an intermediate and final structure obtained according to a prior art process.
Figure 1B:
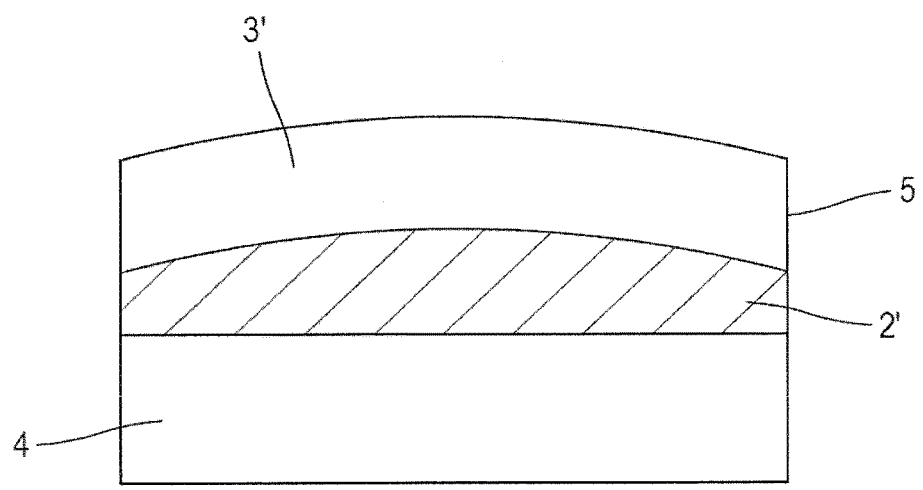
Figure 2A:
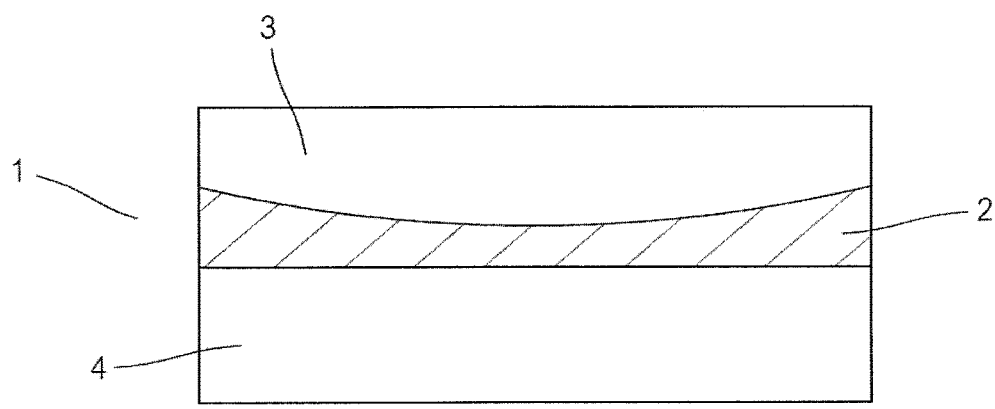
FIGS. 2A-2C show the steps of the process of one particular embodiment of the present invention.

With reference to FIG. 2A, the process comprises providing an intermediate structure 1 comprising in succession an upper semiconductor layer 3, a dielectric layer 2, and a carrier substrate 4. This intermediate structure 1 is treated in a following finishing step so as to form the useful layer 3' having the required properties (thickness, thickness uniformity of the various layers, crystal quality) from the upper layer 3.

The finishing step may thus comprise one treatment or a plurality of treatments chosen, for example, from the following treatments: a sacrificial oxidation, a heat treatment under neutral or reducing atmosphere, dry or wet etching, chemical-mechanical polishing, etc.

Figure 2B:
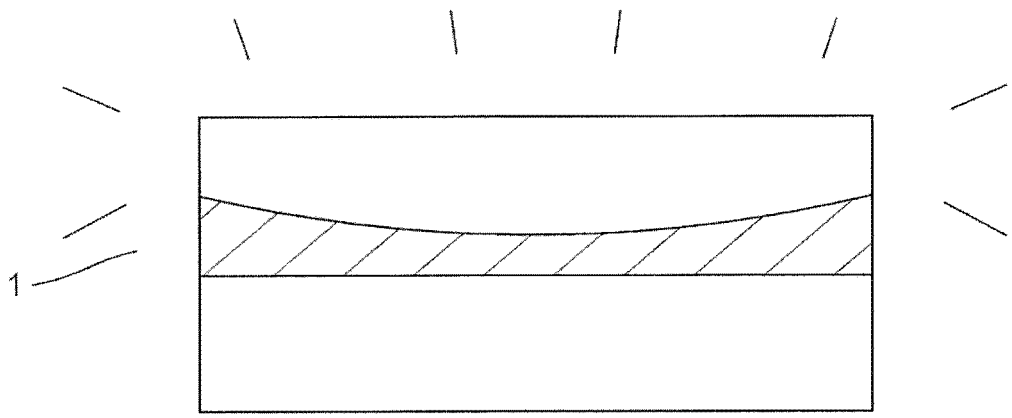
Figure 2C:
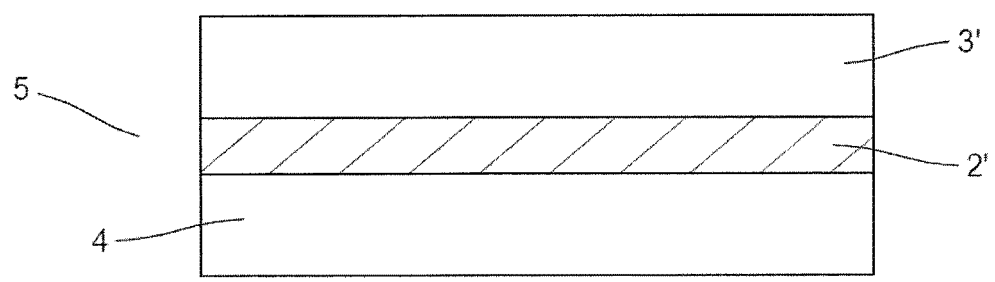

Furthermore, according to the present disclosure, the step of finishing the intermediate structure 1 comprises at least one treatment nonuniformly modifying the thickness of the dielectric layer 2 of the intermediate structure 1. This step is shown in FIGS. 2B and 2C.

The "nonuniformity" of a layer may be measured by the difference between its maximum thickness and its minimum thickness divided by its average thickness. For purposes of the present disclosure, a layer will be considered to be "nonuniform" when its measured nonuniformity exceeds 3%. The thickness of the dielectric layer 2, 2' may be measured by techniques such as ellipsometry or reflectometry.

By way of example, the treatment nonuniformly modifying the thickness of the dielectric layer 2 may correspond to a smoothing anneal, in a batch anneal furnace, in which the upper layer 3 is exposed to a neutral or reducing atmosphere having a temperature above 1,100° C., and more specifically between 1,150° C. and 1,200° C., in order to improve the smoothing effect of the anneal. This exposure to a neutral or reducing atmosphere may be carried out at a plateau temperature value for a length of time that may be between 5 minutes and five hours.

The preceding treatment may alternatively, or in addition, be applied to the useful layer 3' of the final structure 5, i.e., at the end of the finishing step or after the latter treatment, when the intermediate structure 1 has already received one or more of the aforementioned treatments.

This type of smoothing anneal nonuniformly modifies the thickness of the dielectric layer 2 that is located under the upper layer 3 treated. Furthermore, determined treatment conditions lead the thickness of the dielectric layer 2 of the intermediate structure 1 to be nonuniformly modified following a predetermined dissolution profile.

This predetermined dissolution profile corresponds to the difference between the thickness profile of the dielectric layer 2' (of the final structure 5) after the treatment and the thickness profile of the dielectric layer 2 before this treatment (of the intermediate structure 1).

The determined dissolution profile may be represented by a set of measurement points (x, y, e); x and y allowing a point on the surface of the substrate to be located and e indicating the measured thickness of the dielectric layer at this point. Alternatively, the measurement point may be located by its polar coordinates, especially in the case of a substrate of circular shape.

Figure 3:
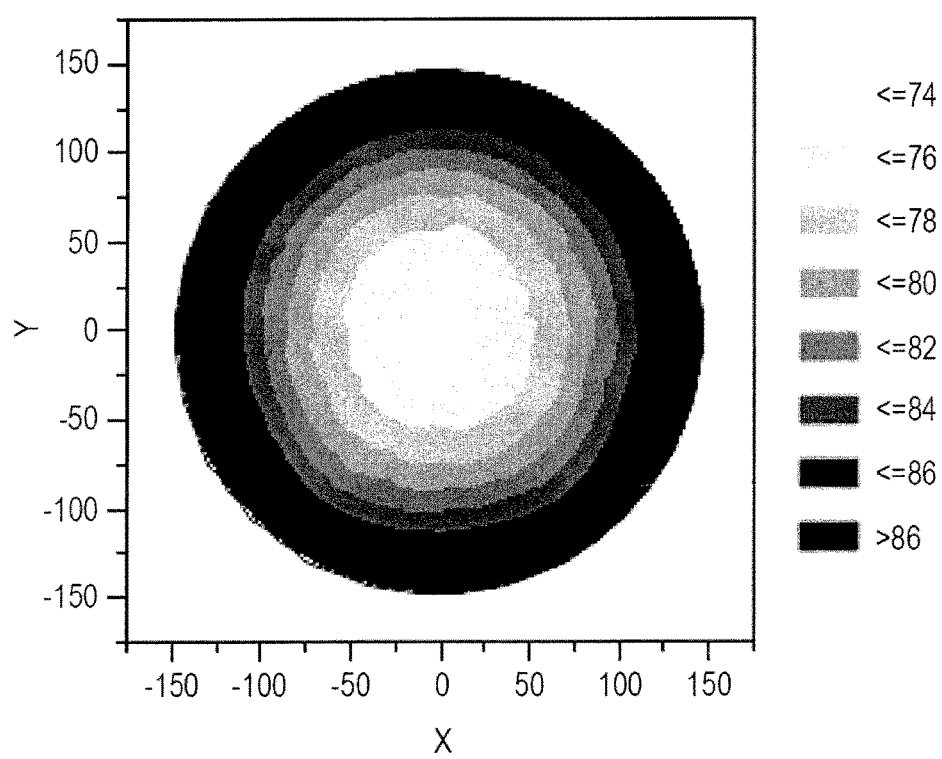
FIG. 3 shows an exemplary dissolution profile.

The set of measurement points has a chosen cardinal direction that, in combination with the positions of these points, allows the dissolution profile to be represented with sufficient precision. Such a profile is shown graphically by way of example in FIG. 3.

For a substrate having the form of a circular wafer of 300 mm diameter, 41 measurement points distributed uniformly over the surface of the wafer may be sufficient.

When the treatment is carried out in a batch anneal furnace, the geometrical configuration of the furnace may lead to a dissolution profile generally having a circular symmetry of axis perpendicular to the plane of the substrate and passing through its center. This is especially the case when the substrate is also rotated during the treatment. In this case, the profile may be represented by a parametric functional form relating the variation in the thickness of the dielectric layer to each point of the structure, for example, taking the form $D(r)=k \cdot r^2$ or the form $D(r)=k \cdot |r|$, where r represents the distance from the point to the center of the structure and k is a parameter of the function.

The determined dissolution profile is representative of the finishing sequence applied to the intermediate structure 1 and, more particularly, is representative of the treatment affecting the thickness of the dielectric layer 2.

This profile may be obtained in a step prior to the process of the present disclosure. This prior step may involve applying, to a similar structure to the intermediate structure 1 or final structure 5 of the present disclosure, the envisaged treatment or finishing sequence. The measurement of the thickness profiles of the dielectric layer 2, 2' before and after the application of this sequence or this treatment allows all of the measurement points or the parameters of the parametric function specifying the predetermined dissolution profile to be established.

Alternatively, the profile may be obtained by calculation or simulation from parameters (for example: duration, temperature, uniformity) of the treatment.

So as to compensate for the thickness nonuniformity of the dielectric layer liable to be created by the treatment of the finishing step, the present disclosure makes provision for the intermediate structure 1 to have a dielectric layer 2, the thickness profile of which is complementary to the predetermined dissolution profile.

By complementary thickness profile, what is meant is a thickness profile that, combined with the predetermined dissolution profile, leads to a profile having a lesser nonuniformity than that of the dissolution profile itself. Practically, the complementary thickness profile of the dielectric layer 2 may be obtained by subtracting the predetermined dissolution profile from the uniform thickness profile desired for the final structure 5.

Thus, after the treatment and/or the finishing sequence, a final structure 5 comprising a useful layer 3', the dielectric layer 2' and the carrier substrate 4 is obtained. The dielectric layer 2' has a smaller thickness nonuniformity than that of the dissolution profile.

The intermediate structure 1 may be produced using various techniques, and especially by layer transfer or using the SIMOX technology. In any case, the formation parameters of the dielectric layer 2 will be adjusted so that its profile is indeed complementary to the predetermined dissolution profile.

In one particular example, the intermediate structure 1 is thus produced by oxidation of a donor semiconductor substrate to form the dielectric layer 2, and then transferring a layer from the donor substrate to the carrier substrate 4, this layer comprising the upper layer 3 and the dielectric layer 2. Alternatively, or in addition, the dielectric layer 2 may be formed on the carrier substrate 4.

The upper layer 3 may be transferred by forming a weak plane in the donor substrate. The layer to be removed from the donor substrate is defined between a surface of the donor substrate and the weak plane formed therein. The donor substrate is then assembled with the main face of the carrier. The layer to be removed is lastly detached from the donor substrate level with the weak plane in order to thus transfer the layer to the carrier substrate 4.

As is well known in the art, the weak plane may be formed by implantation of a light atomic species, or by porosification of a surface of a starting substrate and epitaxial deposition of the layer to be removed on this porosified starting substrate.

Whatever the technique employed to provide the intermediate structure 1, at the end of this step a structure including an upper layer 3, an oxide layer 2, and a carrier substrate 4 is obtained.

Advantageously, the upper layer 3 may comprise or consist of silicon and the dielectric layer 2 may comprise or consist of silicon oxide. The carrier substrate 4 may also comprise or consist of silicon. The structure is then a conventional silicon-on-insulator (SOI) structure.

The silicon oxide layer may be produced by exposing the donor substrate in a furnace to a (dry or moist) oxygen-rich atmosphere. This substrate may be placed, during this step, on a carrier that is rotated around an axis perpendicular to its main plane and passing through its center, thereby leading to formation of an oxide layer on the substrate. The profile of the oxide layer may have a radial symmetry. As is known in the art, control of the parameters of the furnace allows an oxide layer to be formed having a predetermined, chosen thickness profile. In this regard, the reader may refer to documents FR2843487 or US2009/0246371, which illustrate such methods.

The structure 1 may have the form of a circular wafer having a diameter of 200 mm, 300 mm or more.

The present disclosure is particularly useful for the formation of final structures 5 in which the dielectric layer 2' is relatively thin, for example, having an average thickness smaller than or equal to 50 nm, such as between 5 nm and 50 nm, or even between 10 nm and 25 nm. It allows a dielectric layer 2' to be obtained that has a nonuniformity lower than 3% in the final structure 5.

The present disclosure is also advantageous when the useful layer 3' of the final structure 5 has an average thickness smaller than 100 nm, the processes for obtaining such structures being particularly sensitive to the dissolution phenomena and leading to a dielectric layer 2' with a degraded uniformity.

Finally, it is possible for the treatment nonuniformly modifying the thickness of the dielectric layer 2' to also be liable to affect the thickness uniformity of the useful layer 3'. This phenomenon, when its effect is noticeable, may be compensated for by adjusting the parameters of the various treatments of the finishing step(s) (sacrificial oxidation, etching, thinning, etc.) so as to obtain a sufficiently uniform useful layer 3' in the final structure 5.

By way of example, a silicon oxide dielectric layer may be formed on a first donor substrate comprising a circular bulk silicon wafer of 300 mm diameter. This layer may be formed by exposing the wafer to a heat treatment in a furnace, the atmosphere of the furnace being rich in oxygen. The oxidation heat treatment may have a first plateau temperature at 750° C., followed by a plateau temperature at 770° C., then a temperature ramp to reach a plateau temperature of 800° C., and lastly a ramp decreasing to a temperature of 750° C.

This treatment may lead to formation of a silicon dioxide layer having an average thickness of 27 nm and a symmetric and concave profile, the thickness at the periphery of the wafer having a thickness larger by 0.4 nm than the thickness at the center of the wafer.

By way of comparison, a dielectric layer made of silicon dioxide of essentially uniform average thickness equal to 27 nm (i.e., not having a symmetric and concave profile) may be formed on a second donor substrate that is identical to the first.

Next, in these two silicon wafers, each equipped with their dielectric layer made of silicon dioxide, a weak plane may be formed by implantation of light atomic species, such as hydrogen and/or helium, as is well known in the art.

These silicon wafers are then each assembled with a carrier substrate, also comprising a circular bulk silicon wafer of 300 mm diameter. The wafers are assembled, in the particular case of this example, by bringing the silicon dioxide surface of the donor substrates into direct contact with the silicon surfaces of the carrier substrates, according to the direct bonding technique.

These assemblies are then treated in order to fracture the donor substrates along the weak planes previously formed therein, for example, during a weakening anneal having a temperature of between 300° C. and 500° C. The fracture itself may be obtained during this anneal or by applying additional exterior forces.

In the particular context of the example, what is obtained is, on the one hand, residual silicon donor substrates, and on the other hand, the intermediate structures each comprising:
  a 265 nm-thick upper layer made of silicon;
  the silicon oxide dielectric layer having an average thickness of 27 nm (in one case with an extra thickness of 0.4 nm on the periphery, in the other case with a substantially uniform thickness); and
  the carrier substrate.

These intermediate structures are then treated by a succession of finishing steps, which are identical for each of the two structures, allowing the final silicon-on-insulator (SOI) structures to be formed.

In this particular example, firstly a stabilizing treatment is carried out, this treatment comprising a first step of oxidation of the exposed surfaces of the upper layers, followed by an annealing step at a temperature of 950° C., which allows certain defects in the upper layers to be repaired. After this heat treatment, the oxidized portion of the upper layers is removed, for example, by chemical etching in a bath comprising HF. This treatment is therefore a first step of thinning the upper layers.

Next, a smoothing treatment is applied to the exposed surface of the upper layers of the intermediate structures. This is achieved by exposing these layers to a hydrogen atmosphere at a plateau temperature of 1,170° C. for a duration of 5 minutes. This smoothing treatment affects, by dissolution, the uniformity of the buried silicon dioxide layers.

Lastly, a second step of thinning the upper layers by simple sacrificial oxidation is carried out to form the useful layers having a desired thickness, which, in this example, is 15 nm. The oxidation of the upper layers may be carried out at a temperature or temperatures of about 900° C. or 950° C., for a sufficient length of time that the useful layers have the desired thickness at the end of this treatment.

After these treatments, it is observed that the first final structure (obtained from the first donor substrate on which a nonuniform dielectric layer was formed) has an average thickness of 25 nm and a variation in thickness of the dielectric layer made of silicon dioxide of 0.7 nm, i.e., a variation of 2.8%.

The second final structure (obtained from the second donor substrate on which a uniform dielectric layer was formed) has an average thickness of 25 nm and a variation in thickness of the dielectric layer made of silicon dioxide of 1.2 nm of 4.8%.

It will therefore clearly be understood from this example the advantage of providing a dielectric layer in the intermediate structure having a thickness profile complementary to the dissolution profile of the finishing sequence.

The invention claimed is:

1. A process for fabricating a final structure comprising in succession a semiconductor layer having a thickness less than 100 nm, a buried dielectric layer and a carrier substrate, the process comprising:
  providing an intermediate structure including an upper semiconductor layer, the buried dielectric layer and the carrier substrate; and
  finishing the intermediate structure to form the final structure by performing a smoothing anneal on the intermediate structure and nonuniformly modifying, by way of a dissolution effect, a thickness of the buried dielectric layer following a predetermined dissolution profile;
  wherein the buried dielectric layer of the intermediate structure has a thickness profile complementary to the predetermined dissolution profile so as to compensate for the non-uniform modification of the thickness of the buried dielectric layer.

2. The process of claim 1, wherein the semiconductor layer comprises silicon and the dielectric layer comprises silicon oxide.

3. The process of claim 2, wherein the carrier substrate comprises a silicon substrate.

4. The process of claim 3, wherein the dielectric layer of the final structure has an average thickness smaller than or equal to 50 nm.

5. The process of claim 4, wherein the dielectric layer of the final structure has an average thickness in a range extending from 10 nm to 25 nm.

6. The process of claim 4, wherein providing the intermediate structure comprises:
  forming a dielectric layer on a donor substrate;
  forming a weak plane in the donor substrate defining a layer to be removed from the donor substrate between the weak plane and a surface of the donor substrate;
  assembling a face of the donor substrate with the carrier substrate; and
  detaching the layer to be removed from the donor substrate in order to remove the layer from the donor substrate and add the layer to the carrier substrate, the layer forming the upper semiconductor layer of the intermediate structure.

7. The process of claim 6, wherein finishing the intermediate structure further comprises thinning the upper semiconductor layer by sacrificial oxidation in order to form the semiconductor layer.

8. The process of claim 7, wherein finishing the intermediate structure further comprises annealing the intermediate structure to increase a bond strength between the upper semiconductor layer and the carrier substrate.

9. The process of claim 8, wherein nonuniformly modifying the thickness of the dielectric layer comprises exposing the semiconductor layer or the upper semiconductor layer to a neutral or reducing atmosphere at a temperature of between 1,150° C. and 1,200° C.

10. The process of claim 9, wherein the exposure to the neutral or reducing atmosphere is carried out for a length of time of between 5 minutes and 5 hours.

11. The process of claim 10, wherein the thickness profile of the dielectric layer of the intermediate structure and the dissolution profile have a circular symmetry of axis perpendicular to the plane of the structure and passing through a center of the structure.

12. The process of claim 1, wherein the carrier substrate comprises a silicon substrate.

13. The process of claim 1, wherein the dielectric layer of the final structure has an average thickness smaller than or equal to 50 nm.

14. The process of claim 13, wherein the dielectric layer of the final structure has an average thickness in a range extending from 10 nm to 25 nm.

15. The process of claim 1, wherein providing the intermediate structure comprises:
   forming a dielectric layer on a donor substrate;
   forming a weak plane in the donor substrate defining a layer to be removed from the donor substrate between the weak plane and a surface of the donor substrate;
   assembling a face of the donor substrate with the carrier substrate; and
   detaching the layer to be removed from the donor substrate in order to remove the layer from the donor substrate and add the layer to the carrier substrate, the layer forming the upper semiconductor layer of the intermediate structure.

16. The process of claim 1, wherein finishing the intermediate structure further comprises thinning the upper semiconductor layer by sacrificial oxidation in order to form the semiconductor layer.

17. The process of claim 1, wherein finishing the intermediate structure further comprises annealing the intermediate structure to increase a bond strength between the upper semiconductor layer and the carrier substrate.

18. The process of claim 1, wherein nonuniformly modifying the thickness of the dielectric layer comprises exposing the semiconductor layer or the upper semiconductor layer to a neutral or reducing atmosphere at a temperature of between 1,150° C. and 1,200° C.

19. The process of claim 18, wherein the exposure to the neutral or reducing atmosphere is carried out for a length of time of between 5 minutes and 5 hours.

20. The process of claim 1, wherein the thickness profile of the dielectric layer of the intermediate structure and the dissolution profile have a circular symmetry of axis perpendicular to the plane of the structure and passing through a center of the structure.

\* \* \* \* \*